(12) United States Patent
Hauser et al.

(10) Patent No.: US 6,541,311 B1
(45) Date of Patent: Apr. 1, 2003

(54) METHOD OF POSITIONING A COMPONENT MOUNTED ON A LEAD FRAME IN A TEST SOCKET

(75) Inventors: Christian Hauser, Regensburg; Ulrich Vidal, Landshut; Harald Widner, Abensberg, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/680,736

(22) Filed: Oct. 6, 2000

Related U.S. Application Data

(63) Continuation of application No. PCT/DE99/00886, filed on Mar. 24, 1999.

(30) Foreign Application Priority Data

Apr. 6, 1998 (DE) .......................................... 198 15 405

(51) Int. Cl.⁷ ................................................. H01L 21/44
(52) U.S. Cl. ...................................... 438/123; 438/124
(58) Field of Search ................................ 438/123, 124, 438/17

(56) References Cited

U.S. PATENT DOCUMENTS 5,550,402 A  *  8/1996  Nicklaus ..................... 257/669
5,643,835 A  *  7/1997  Chia et al. ................... 437/211

FOREIGN PATENT DOCUMENTS

| | | | |
|---|---|---|---|
| DE | 196 25 384 A1 | 1/1998 | |
| EP | 0 397 320 A2 | 11/1990 | |
| JP | 55-71047 | 5/1980 | |
| JP | 60035550 | 2/1985 | |
| JP | 62065445 | 3/1987 | |
| JP | 63131557 | 6/1988 | |
| JP | 63-152162 | 6/1988 | |
| JP | 63164251 | 7/1988 | |
| JP | 63-164251 | * 7/1988 | ........... H01L/23/50 |
| JP | 63202947 | 8/1988 | |
| JP | 63228656 | 9/1988 | |
| JP | 4-93057 | 3/1992 | |
| JP | 5109930 | 4/1993 | |
| JP | 6021274 | 1/1994 | |
| JP | 6061631 | 3/1994 | |
| JP | 6-132449 | 5/1994 | |
| JP | 8279585 | 10/1996 | |

* cited by examiner

*Primary Examiner*—Kamand Cuneo
*Assistant Examiner*—Scott B. Geyer
(74) *Attorney, Agent, or Firm*—Laurence A. Greenberg; Werner H. Stemer; Gregory L. Mayback

(57) ABSTRACT

A lead frame is configured with conductor leads, a dam bar and an extension between the conductor leads. The extension projects from the dam bar toward a central region of the lead frame. An electronic component is mounted on the lead frame and is brought into electrical contact with inner leads. The component and the lead frame are encased by injection molding. The extension is then isolated from the rest of the lead frame and is removed from the housing body. Thus a separating face is produced between the housing body and the extension. The separating face is used as a reference when positioning the component in a test socket.

4 Claims, 5 Drawing Sheets a) CONFIGURE LEAD FRAME WITH LEADS, DAM BAR AND EXTENSIONS b) MOUNT COMPONENT ON LEAD FRAME c) CONTACT COMPONENT WITH INNER LEADS d) MOLD AROUND COMPONENT AND LEAD FRAME TO DAM BAR e) ISOLATE EXTENSIONS FROM REMAINING LEAD FRAME f) REMOVE EXTENSIONS FROM HOUSING BODY g) POSITION COMPONENT WITH SEPARATING FACE

METHOD OF POSITIONING A COMPONENT MOUNTED ON A LEAD FRAME IN A TEST SOCKET

CROSS-REFERENCE TO RELATED APPLICATION

This application is a continuation of copending International Application No. PCT/DE99/00886, filed Mar. 24, 1999, which designated the United States.

BACKGROUND OF THE INVENTION

Field of the Invention

The invention is in the field of mounting techniques for a semiconductor component, in particular a memory element. The semiconductor component has a housing or housing body which is formed around the semiconductor component after the semiconductor component is brought into contact with a lead frame.

Published, Non-Prosecuted German Patent Application DE 196 25 384 A1 discloses a method of producing a component and a lead frame. In order to provide an electrical contact and possibly also to distribute and dissipate the energy converted into heat in an electronic component, a lead frame is used. Such a lead frame is normally produced with a large number of further lead frames in a coherent strip and, in particular, includes a carrier region (island) for the component and input or output lines for providing an electrical contact, which in the following text are also referred to as conductor leads or conductor tracks. The lead frame can in principle also be configured to implement the so-called lead on chip (LOC) technique, which is known per se. The lead frames are initially coherent in the strip. The individual lead frames and thus the individual components are only separated at an advanced mounting stage.

During the mounting of components, the conductor leads are normally connected to one another by connecting webs formed between them in the form of a so-called "dam bar". In addition to increasing the mechanical stiffness during the fabrication process, the dam bar is used with its upper or lower side as a defined sealing surface for the injection molds. At the dam bar, the molding tools seal off a housing volume which is to be filled with a press-molding compound and in which the housing body is produced. The housing body encloses the component and the central regions of the lead frame after the injection of the press-molding compound. Subsequent to the formation of the housing body, the dam bar, that is to say the webs or intermediate sections connecting the individual conductor leads to one another, are removed, so that the conductor leads are electrically isolated from one another. In addition, the conductor leads are bent into predefined shapes in order allow a contacting for an operation of the component after undergoing functional tests. The contacting may be achieved by soldering.

For the purpose of the aforementioned functional tests, the components have to be introduced into test sockets, respectively specific to the component, and electrical contact has to be made with them. Given the increasingly smaller dimensions of the conductor leads and the conductor-track spacings, very precise alignment and centering of the component in the respective test socket is required. However, the close tolerances to be complied with cannot always be ensured in the case of conventional components, because of considerable variations in the external dimensions of the housing bodies. The alignment and centering of the components is normally carried out via stops on the test socket which cooperate with housing-body edges—in particular the corners of the housing body. The position of the housing-body edges or corners varies considerably in relation to the conductor leads with which contact is to be made. The reasons for this are, in particular, the comparatively high fabrication tolerances with regard to the external dimensions of the housing bodies, and the press-molding compound flash or burr-type parting line produced during the formation of the housing body.

In the case in which the components are fixed in the test sockets by hold-downs acting on the leads, in the worst case a bending of the leads and therefore damage to the component can occur, as a result of which the component may be damaged and even become unusable.

SUMMARY OF THE INVENTION

It is accordingly an object of the invention to provide a method for positioning a component mounted on a lead frame in a test socket which overcomes the above-mentioned disadvantages of the heretofore-known methods of this general type and which allows the use of the structural configuration of the component as a reference when positioning the component, and which allows a reliable, highly accurate and reproducible positioning of the leads.

With the foregoing and other objects in view there is provided, in accordance with the invention, a method of positioning a component mounted on a lead frame in a test socket, which includes the steps of:

providing a lead frame with outwardly directed conductor leads subdivided into outer leads and inner leads, the conductor leads being connected to one another by connecting webs (dam bars) formed between the conductor leads, at least one of the connecting webs having an intermediate section provided between two of the conductor leads and the lead frame having an extension on a side of the intermediate section facing the inner leads;

mounting a component on the lead frame and electrically contacting the component and the inner leads;

enclosing the component in a press-molding compound for forming a housing body and forming a contact face between the extension and the press-molding compound;

removing the intermediate section and thus transforming the contact face into a separating face formed on the housing body; and using the separating face as a reference for positioning the component in a test socket.

In other words, according to the invention, the structural nature of an electronic component is used as a reference when positioning a component, which includes at least one electronic element, a housing body and a lead frame. The component is mounted on the lead frame and, for the purpose of external electrical connection, is brought into contact with outwardly leading conductor leads on the lead frame. The component and the central region of the lead frame are enclosed in a press-molding compound which forms the housing body. The lead frame initially has an extension, which can be separated from the lead frame after the formation of the housing body and the extension can be removed from the housing body, so that a separating face which is accessible from the outside is produced between the extension and the housing body. The separating face is used as a reference when positioning the component.

A significant advantage of the method according to the invention is that, at the points on the housing body which are critical for the alignment and centering, no press-molding compound flash or burr can remain and/or be broken out of the press-molding compound in an undefined way. Thus a highly accurate reference face or reference edge is produced on the housing body. The reference face or reference edge is advantageously simply produced in that during the removal of the extension on the housing body, the separating face originally formed between the extension and the press-molding compound of the housing body is exposed. The separating face is produced extremely precisely in relation to the lead frame and therefore in relation to the positions of the conductor tracks or leads. The tolerance of the indirect positioning of the conductor leads via the separating face of the housing body therefore essentially corresponds to the extremely close fabrication tolerance of the lead frame.

A preferred embodiment of the method according to the invention provides that, a number of conductor leads initially remain connected to one another via intermediate sections in order to form a dam bar, the extension being formed on at least one of the intermediate sections. This has in particular the advantage that the isolation of the extension from the lead frames and the subsequent removal can be carried out in the course of a so-called dam bar cutting process (removal of the intermediate sections between the conductor leads). It is particularly advantageous if the isolation and removal of the extension are carried out in a joint operation with the dam bar cutting. The intrinsically already well managed steps of tailoring the lead frames (for example the dam bar cutting) can consequently be maintained in the conventional manner and the usual sequence.

According to another mode of the invention, which is particularly preferred in terms of production, provides the extension as a lug extending toward the lead frame center.

With regard to the positioning of the component, for example in a test socket, another mode of the invention is particularly preferred in accordance with which in each case an extension is provided in a corner area of the lead frame in such a way that, after the formation of the housing body, the extension is located in a corner of the housing.

Other features which are considered as characteristic for the invention are set forth in the appended claims.

Although the invention is illustrated and described herein as embodied in a method for positioning a component mounted on a lead frame in a test socket, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1b is a diagrammatic plan view of a detail of the lead frame of FIG. 1a;

FIG. 2b is a diagrammatic plan view of a detail of the lead frame of FIG. 2a;

FIG. 3b is a partial sectional view of a cutting tool, the lead frame and the press-molding compound along section line III—III in FIG. 3a;

FIG. 4b is a partial sectional view of a cutting tool, the lead frame and the press-molding compound along section line IV—IV in FIG. 4a;

FIG. 6b is a plan view of a detail of the component and of a corner stop as shown in FIG. 6a;

FIG. 7b is a partial sectional view of the cutting tool, the lead frame and the press-molding compound along section line VII—VII in FIG. 7a;

FIG. 8b is a partial sectional view of the cutting tool, the lead frame and the press-molding compound along section line VIII—VIII in FIG. 8a;

DESCRIPTION OF THE PREFERRED EMBODIMENTS

Figure 1B:
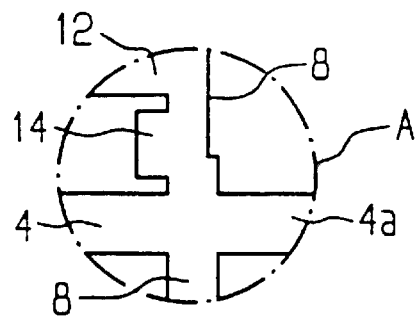
Figure 1A:
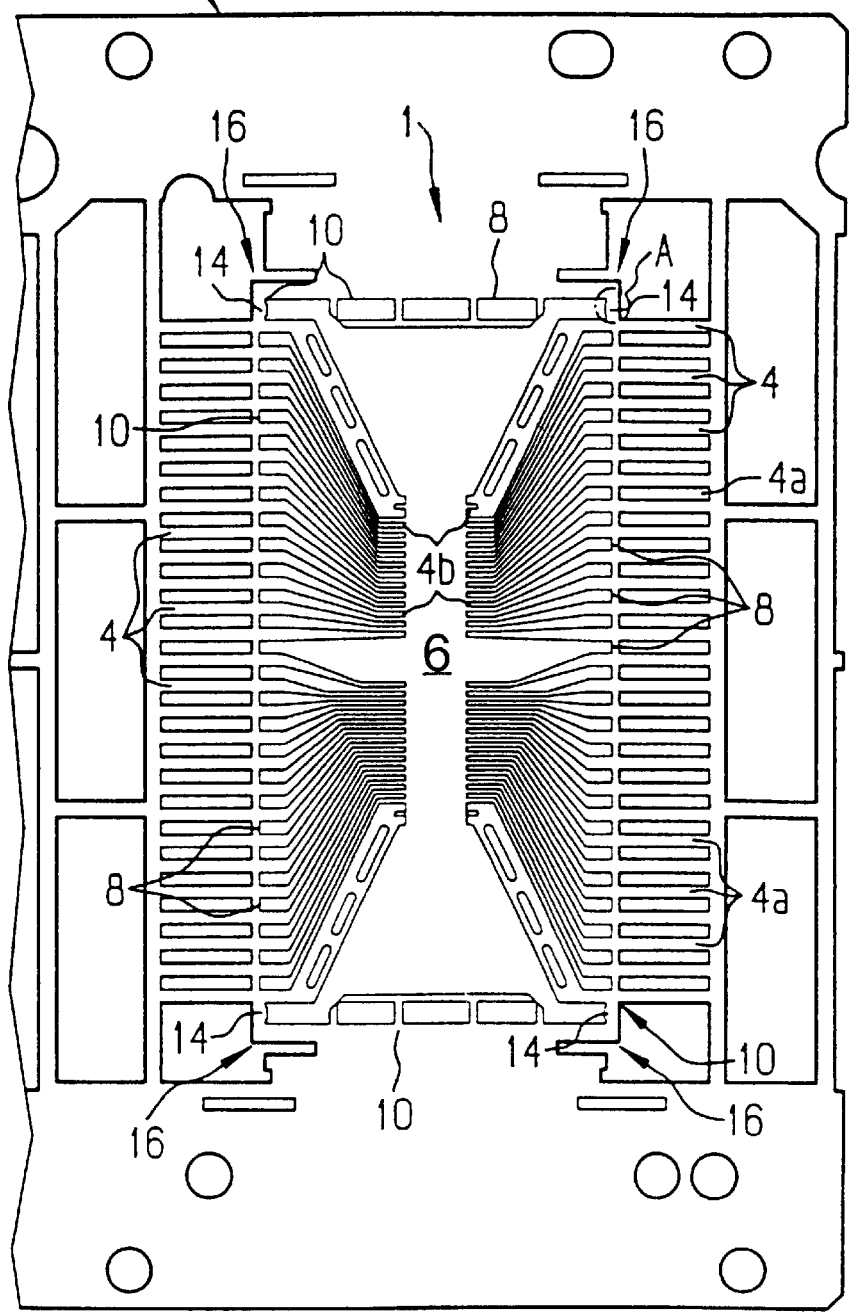
FIG. 1a is a diagrammatic plan view of a lead frame for use in the method according to the invention.

Referring now to the figures of the drawings in detail and first, particularly, to FIGS. 1a to 2c thereof, there is shown a lead frame which is a constituent part of a strip 3 including a large number of identical lead frames 1. The individual lead frames 1, together with the strip, pass through a large number of fabrication steps until, ultimately, the lead frames are separated from one another.

The lead frames 1 have a large number of conductor leads 4 in a manner known per se (cf. Published, Non-Prosecuted German Patent Application DE 196 25 384 A1, for example), which extend from outer leads 4a to a center of the lead frame as far as so-called inner leads 4b. The inner leads 4b are bonded or brought into contact with an electronic component, for example a semiconductor memory, in a manner which is known and not specifically illustrated. During the configuration of the lead frame 1, the conductor leads 4 initially remain connected to one another at the sides via intermediate pieces 8. The intermediate pieces 8 lying in a line, together with the respective material of adjacent conductor leads 4, produce a web which is also referred to as a dam bar 10.

A significant aspect of the invention is that the lead frame additionally has at least one extension 14, which preferably lies in the plane of the other lead frame parts and is easy to separate from the rest of the lead frame. In the exemplary embodiment, an intermediate piece 8 is formed between the uppermost conductor lead 4 and an upper connecting web 12 of the lead frame. This area is shown in FIG. 1b in a greatly enlarged illustration of the detail A.

The extension 14 is formed as a lug or tongue which extends toward the central axis of symmetry of the lead frame. In the exemplary embodiment, three further extensions 14 are provided in a corresponding way, each in one corner area 16 of the lead frame 1.

Figure 2C:
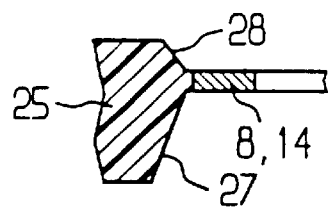
FIG. 2c is a partial sectional view of the lead frame and the press-molding compound along section line II—II in FIG. 2b.
Figure 2B:
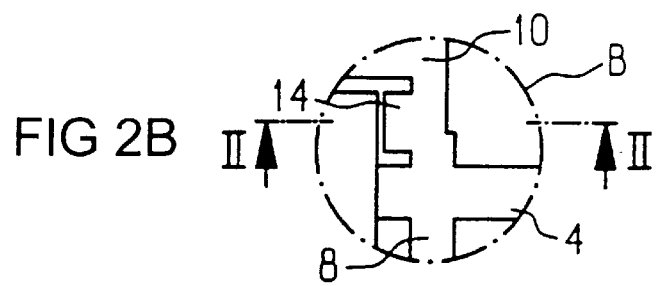
Figure 2A:
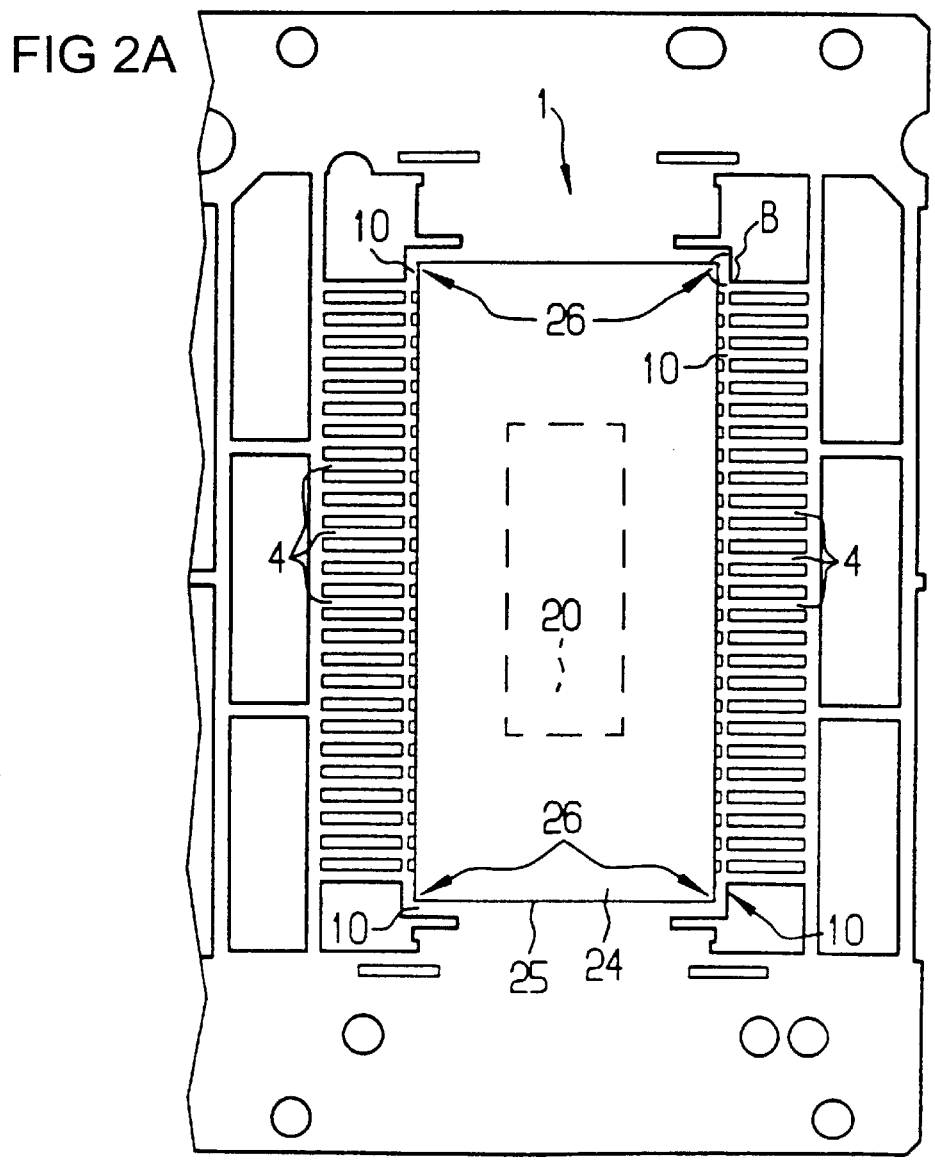
FIG. 2a is a diagrammatic plan view of the lead frame according to FIG. 1a after being enclosed by a press-molding compound.
Figure 3B:
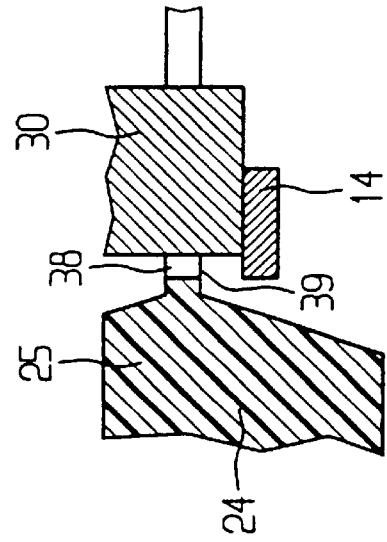

In the course of the further fabrication sequence, firstly an electronic component 20, which is indicated with a dashed line in FIG. 2a, is mounted on the lead frame 1 and electrical contact is made between its electrical contact areas, provided for the purpose of electrical connection, and the inner ends or inner leads 4b (see FIG. 1a) of the conductor leads 4. The semifabricated component is then introduced into an injection mold or molding tool, the upper and lower halves of the mold interacting with sealing surfaces on the upper side and underside of the dam bar 10. When the injection mold is closed, a suitable press-molding compound 24 is forced into the cavity formed by the mold and, as a result, the component 20 and the inner area of the lead frame 1 are covered, forming a housing body 25. After being removed from the molding tool, the component has the configuration as shown in FIGS. 2a to 2c. As shown by the detail B in FIG. 2b and by the section along II—II through the detail B, after the housing body 25 has been formed, one of the extensions 14 is located in each corner 26 of the housing. The housing body 25 with its right-hand side faces 27, 28 is shown in FIG. 2c.

Figure 4B:
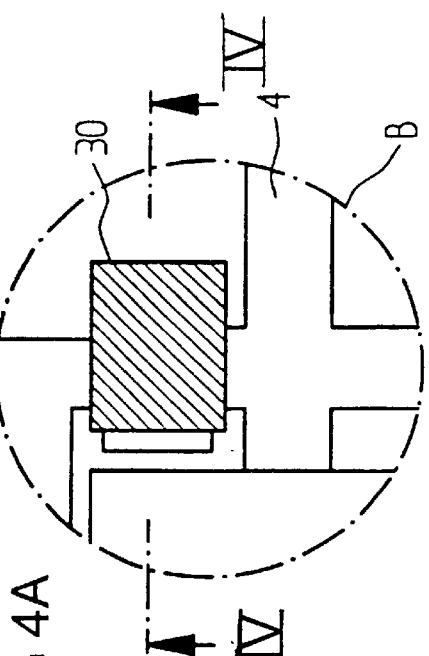
Figure 3A:
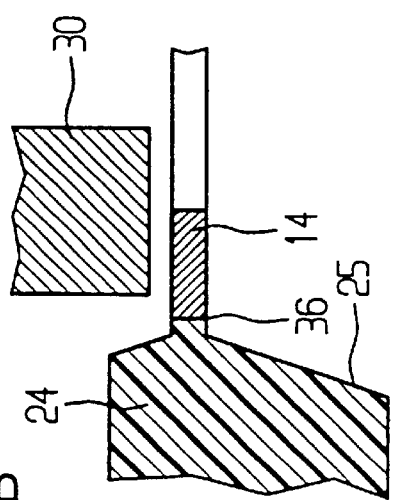
FIG. 3a is a sectional plan view of a cutting tool and the lead frame with the press-molding compound as shown in FIG. 2b just prior to the cutting action of the cutting tool for a dam bar cutting.
Figure 4A:
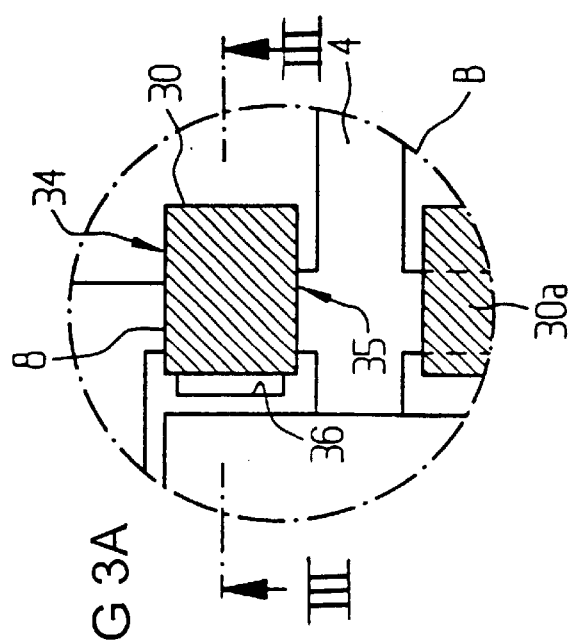
FIG. 4a is a sectional plan view of a cutting tool and the lead frame with the press-molding compound as shown in FIG. 2b after the dam bar cutting.

As FIGS. 3a to 4b illustrate with reference to the enlarged detail B shown in FIGS. 2a to 2c, the extensions 14 are firstly isolated from the other remaining constituent parts of the lead frame 1 during the subsequent dam bar cutting with a cutting punch 30. The other intermediate sections 8 of the dam bar 10 are simultaneously removed by correspondingly disposed cutting punches (FIG. 3a indicates a further punch 30a), isolating the conductor leads 4. FIGS. 3a and 3b show the state shortly before the dam bar cutting action and FIGS. 4a and 4b show the punch 30 just penetrating the plane of the (former) dam bar 10. In this embodiment of the method according to the invention, the severing and removal of the extension are advantageously carried out in a joint operation. The extension 14 is initially isolated by severing its connection to the adjacent intermediate section 8 and to the conductor lead 4 with an upper 34 and lower cutting edge 35 of the punch 30. In the process, the extension 14 protrudes under the punch 30 toward the center of the lead frame. The extension 14 is subsequently severed downward from the housing body 25 by the movement of the punch 30. The previous contact face 36 between extension 14 and press-molding compound 24 of the housing body 25 is therefore transformed into a separating face 38. This separating face 38 is used as a reference during the subsequent positioning of the component, for example for test purposes.

The method according to the invention therefore provides a separating face 38 which can be used advantageously for reference purposes and whose relative position, for example in relation to the ends 4a of the conductor leads 4, is essentially determined only by the production precision of the lead frame 1. Of course, the reference face 38 can also be used for other positioning purposes of the component, for example during assembly. As FIGS. 3a to 4b show, in the area of the extension 14, no flash or burr is broken from the housing body 25 in an undefined way; instead, during the dam bar cutting, the extension is pressed out in such a way that a precisely defined edge 39 or face is produced.

Figure 5:
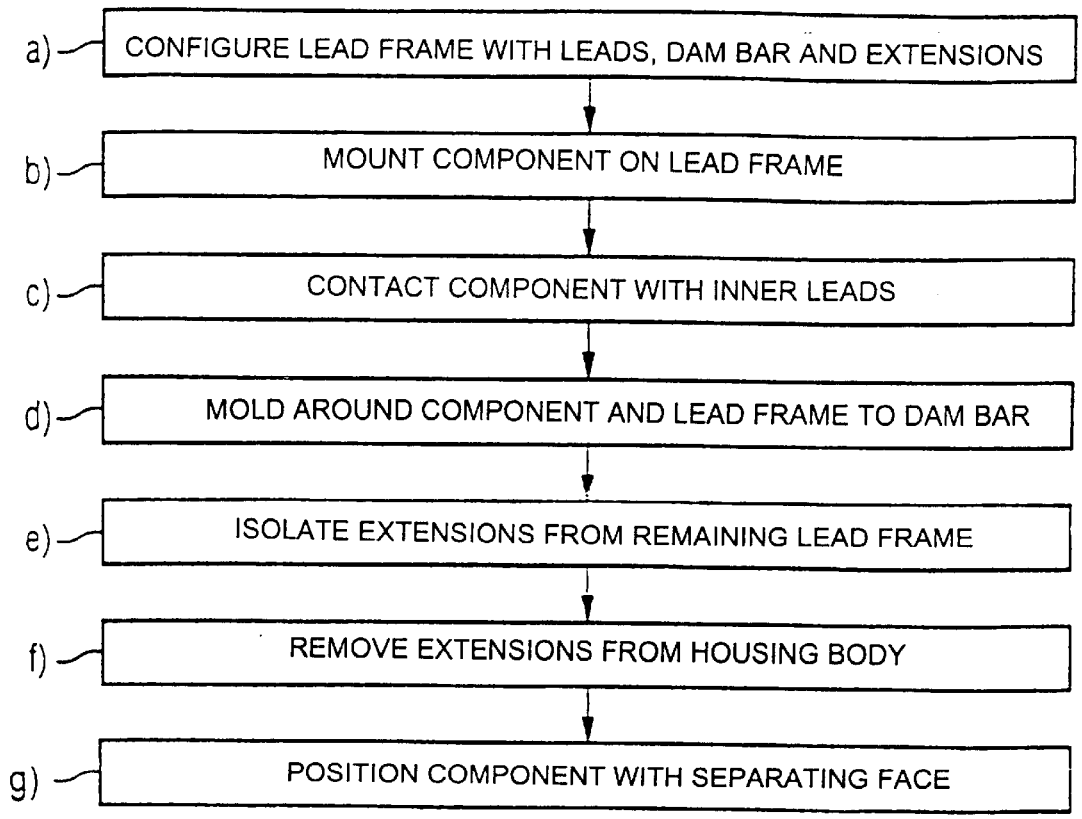
FIG. 5 is a flow chart for illustrating the positioning of the component.

The above-described method with its steps is summarized in a flow diagram in FIG. 5. What is essential here is the use of a lead frame having defined extensions (step a)) which, subsequent to an assembly (step b), c)) and an injection-molding around the component and the lead frame (step d)), are preferably cut together with the dam bar (step e)) and subsequently removed from the housing body, forming the separating face (step f)). Finally, (step g)), the separating face is used for positioning the component.

In order explain the advantages which can be achieved by using the method according to the invention and by using the lead frame according to the invention, the problems in the case of components fabricated in accordance with conventional methods will be explained with reference to FIGS. 6a to 8b.

Figure 6A:
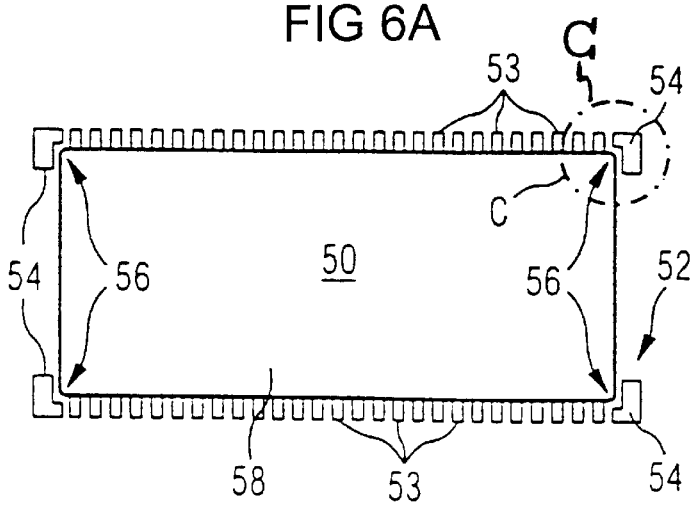
FIG. 6a is a plan view of a component and corner stops for illustrating alignment problems in case of conventional components.
Figure 6B:
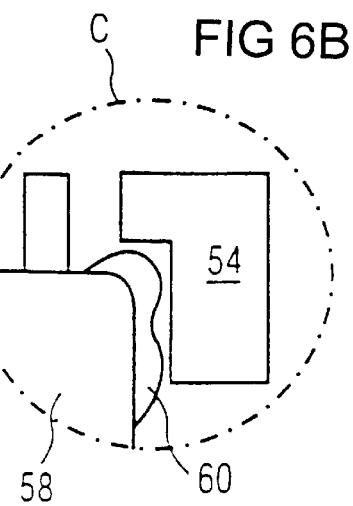
Figure 7A:
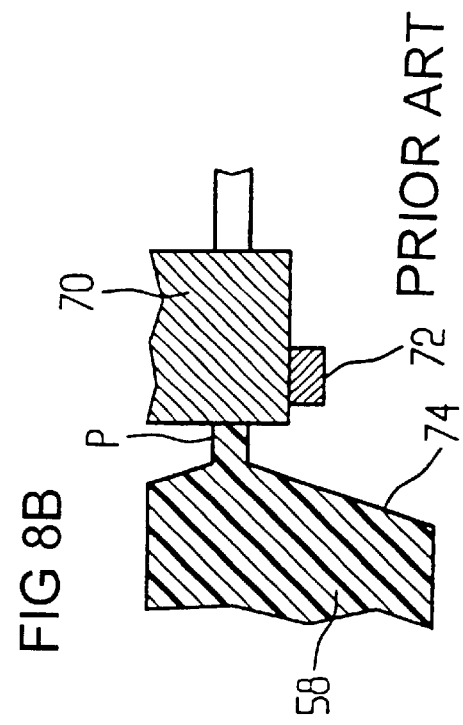
FIG. 7a is a sectional plan view of a cutting tool and a lead frame with a press-molding compound just prior to the cutting action of a cutting tool in accordance with a conventional method.
Figure 7B:
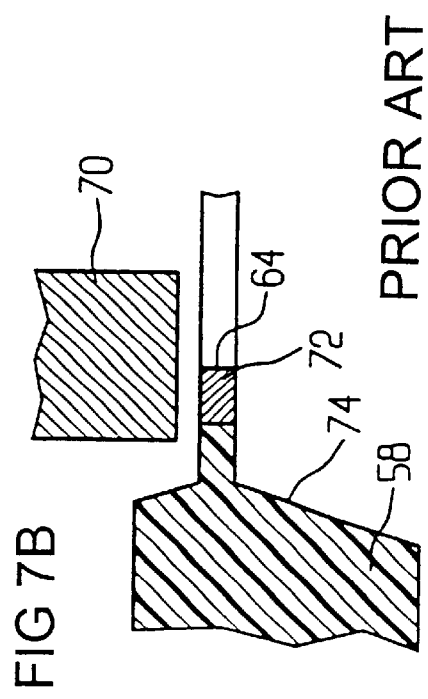
Figure 8A:
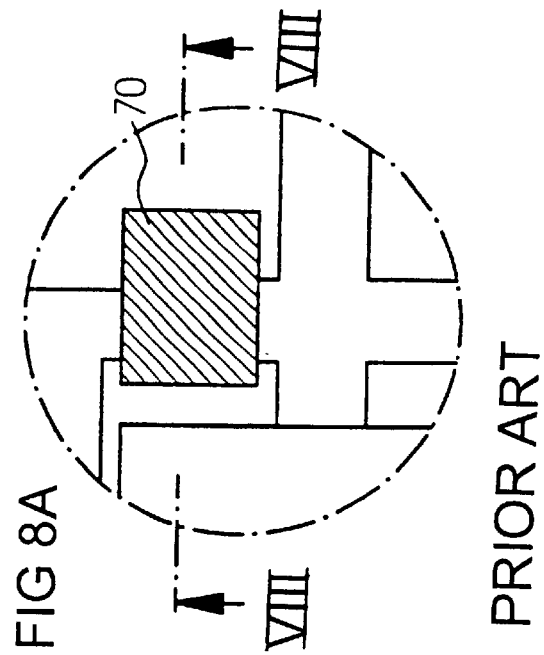
FIG. 8a is a sectional plan view of a cutting tool and the lead frame with the press-molding compound after the dam bar cutting in accordance with a conventional method.
Figure 8B:
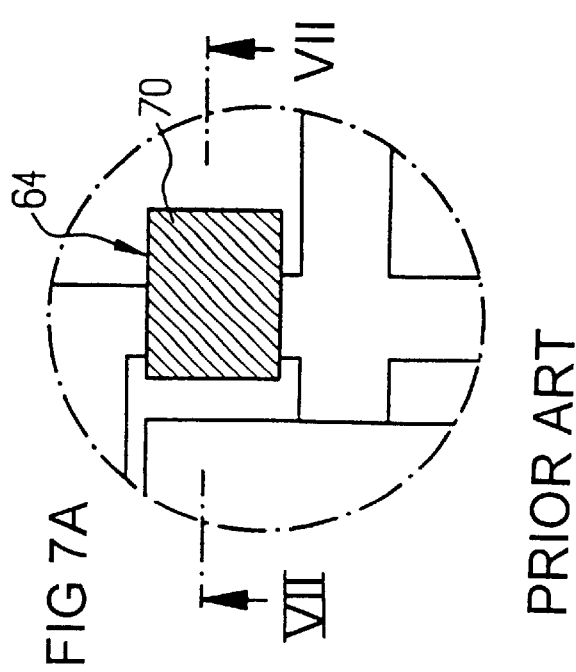

FIG. 6a schematically shows a component 50 which has been produced in accordance with a conventional method and which, for an electrical functional test, has been introduced into a test socket 52. Because of the relatively small dimensions and spacings of the conductor leads or conductor tracks 53, a very precise centering of the component 50 in the socket 52 is required. In order to align the component 50, corner stops 54 are provided on the socket 52. These cooperate with the corners 56 of the housing body 58 of the component 50. As the enlarged illustration of the detail C shows particularly clearly, a flash or burr 60 can remain between the centering stop 54 of the test socket 52 and the corner 56 of the housing body 58, and prevent correct contact between the housing 58 and the centering stop 54. In addition, the corners 56 of the housing are generally subject to comparatively large positional tolerances in relation to the position of the leads. When the lead ends are subsequently pressed down onto contact points on the test socket, in unfavorable cases the leads can be bent and the component can therefore become unusable.

The undefined flash is produced during the processing (illustrated in FIGS. 7a to 8b) of the conventionally produced housing body 58 in that, between the dam bar 64 and the press-molding compound of the housing 58, a thin "skin" of flash is produced during the press-molding operation. Although the punch 70 then cuts out the intermediate piece 72 to be removed from the dam bar during the dam bar cutting, the remaining molding flash breaks in an uncontrolled way at a point P between the punch 70 and the left-hand side wall 74 of the housing body 58.

In contrast thereto, the method according to the invention, in a manner which is simple in terms of production and uses a configuration of the lead frame which has to be modified only slightly, configures selected points in such a way that no undefined break at a flash or burr on the housing body takes place. Instead, the dam bar is cut and pressed out in such a way that, in the areas defined by the extensions, separating faces or separating edges result which are used for an extremely precise positioning of the component.

We claim:

1. A method of positioning a component mounted on a lead frame in a test socket, the method which comprises:

providing a lead frame with outwardly directed conductor leads subdivided into outer leads and inner leads, the conductor leads being connected to one another by intermediate sections, the intermediate sections being disposed in a line and forming a connection web together with a material of adjacent conductor leads, lead frame having other lead frame parts and an extension on a side of the intermediate section facing the inner leads;

mounting a component on the lead frame and electrically contacting the component and the inner leads;

placing the extension and any of the other lead frame parts in the same plane;

mounting a component on the lead frame and electrically contacting the component and the inner leads;

enclosing the component in a press-molding compound for forming a housing body and forming a contact face between the extension and the press-molding compound, the extension being located in a corner of the housing body;

isolating the extension from the lead frame during cutting of the connection web and simultaneously removing given intermediate sections of the connection web and thus transforming the contact face into a separating face formed on the housing body; and positioning the component in the test socket using the separating face as a reference.

2. The method according to claim 1, which comprises providing the lead frame such that the extension is a lug extending toward a center region of the lead frame.

3. The method according to claim 2, which comprises providing the lead frame such that the extension and any other lead frame parts are disposed in one plane.

4. The method according to claim 1, which comprises:

providing the lead frame with four extensions respectively disposed at corners regions of a rectangle; and forming contact faces disposed at respective corners of the housing body.

* * * * *

UNITED STATES PATENT AND TRADEMARK OFFICE
CERTIFICATE OF CORRECTION

PATENT NO. : 6,541,311 B1
DATED : April 1, 2003
INVENTOR(S) : Christian Hauser et al.

It is certified that error appears in the above-identified patent and that said Letters Patent is hereby corrected as shown below:

Column 6,
Line 61, should read:
-- the lead frame having other lead frame parts and an exten- --

Signed and Sealed this

Twenty-sixth Day of August, 2003

JAMES E. ROGAN
*Director of the United States Patent and Trademark Office*

UNITED STATES PATENT AND TRADEMARK OFFICE
CERTIFICATE OF CORRECTION

PATENT NO.      : 6,541,311 B1                                          Page 1 of 1
DATED           : April 1, 2003
INVENTOR(S)     : Christian Hauser et al.

It is certified that error appears in the above-identified patent and that said Letters Patent is hereby corrected as shown below:

Column 6,
Lines 64-65, should be deleted.

Signed and Sealed this

Twenty-fifth Day of November, 2003

JAMES E. ROGAN
*Director of the United States Patent and Trademark Office*